United States Patent
Rodriguez

(10) Patent No.: US 7,667,997 B2
(45) Date of Patent: Feb. 23, 2010

(54) METHOD TO IMPROVE FERROELECTRONIC MEMORY PERFORMANCE AND RELIABILITY

(75) Inventor: John Rodriguez, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 123 days.

(21) Appl. No.: 11/965,350

(22) Filed: Dec. 27, 2007

(65) Prior Publication Data
US 2009/0168488 A1    Jul. 2, 2009

(51) Int. Cl.
*G11C 11/22* (2006.01)

(52) U.S. Cl. ...................................... 365/145
(58) Field of Classification Search ................... 365/145
See application file for complete search history.

(56) References Cited
U.S. PATENT DOCUMENTS
5,953,245 A * 9/1999 Nishimura .................. 365/145
6,781,864 B2 * 8/2004 Basceri et al. .............. 365/145

\* cited by examiner

*Primary Examiner*—Amir Zarabian
*Assistant Examiner*—Anthan T Tran
(74) *Attorney, Agent, or Firm*—Rose Alyssa Keagy; Wade J. Brady, III; Frederick J. Telecky, Jr.

(57) ABSTRACT

One embodiment of the present invention relates to a method by which the imprint of a ferroelectric random access memory (FRAM) array is reduced. The method begins when an event that will cause imprint to the memory array is anticipated by an external agent to the device comprising the chip. The external agent sends a command to the control circuitry that the data states are to be written to a particular data state. Upon receiving a signal the control circuitry writes all of the ferroelectric memory cells in the FRAM array to a preferred memory data state. The memory data states are held in the preferred data state for the entire duration of the event to minimize imprint of the FRAM memory cells. When the event ends the external agent sends a command to the control circuitry to resume normal memory operation. Other methods and circuits are also disclosed.

19 Claims, 7 Drawing Sheets

METHOD TO IMPROVE FERROELECTRONIC MEMORY PERFORMANCE AND RELIABILITY

FIELD OF INVENTION

The present invention relates generally to semiconductor devices and more particularly to improvement of reliability in ferroelectric random-access memory (FRAM) arrays.

BACKGROUND OF THE INVENTION

In recent years the market of the semiconductor industry has grown considerably for supplying integrated chips to companies which manufacture portable electronic device. The integrated chips used to make these portable electronic device, such as cell phones, PDAs, laptop computers and the like, are mostly made in emerging technology nodes. This is because emerging technology nodes offer higher density chips with greater performance and lower power consumption. These qualities are important to portable electronic devices which are continually striving to offer greater functionality while relying on relatively small energy sources (e.g., batteries). The demand for these products has driven the industry to devote many resources to developing low power integrated chips, often resulting in specific processes.

One aspect of power consumption in integrated circuits is the power consumption of memory cells. There are two main types of memory, volatile memory and non-volatile memory. Volatile memory (e.g., SRAM, DRAM) is memory which requires power to retain its information. Non-volatile memory (e.g., EEPROM, flash) is memory which does not require power to retain its information. In recent years the use of non-volatile memory has become common place in portable electronics. Many portable electronic devices such as cell phones or digital cameras will rely upon a stick or card which uses flash memory as storage. Unfortunately, the performance and density of flash memory and other wide spread commercially available non-volatile memory sources lag behind that of volatile memory.

To amend this problem the semiconductor industry has put an increased emphasis on research into ferroelectric memory. Ferroelectric random-access memory (FRAM) is a non-volatile random access memory that offers advantages in terms of power consumption and write speed over existing non-volatile memory sources such as flash or EEPROM. FRAM memory utilizes a ferroelectric material as a dielectric for memory array capacitors. Due to the use of a ferroelectric material rather than traditional dielectrics, reliability of FRAM memory cells face new problems not present in traditional memory types. One such problem occurs when FRAM memory cells remain in the same data state for a prolonged period of time. They will develop a preference to stay in that particular data state. This preference for a particular state drives an increase in signal margin loss over time, resulting in device degradation and reliability concerns.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary delineate the scope of the invention.

One embodiment of the present invention relates to a method by which the imprint of a ferroelectric random access memory (FRAM) array is reduced. The method begins when an agent external to the device comprising the chip anticipates an event that will cause imprint to the FRAM memory array. The external agent sends a command to the control circuitry that the data states are to be written to a particular data state. Upon receiving the signal, the control circuitry writes all of the ferroelectric memory cells in the FRAM array to a preferred memory data state. The memory data states are held in the preferred data state for the entire duration of the event to minimize imprint of the FRAM memory cells. When the event ends the external agent sends a command to the control circuitry to resume normal memory operation.

An alternative embodiment of the present invention also relates to a method by which the imprint of a ferroelectric random access memory (FRAM) array is reduced. The method begins when an event that will cause imprint to the FRAM memory array is detected by a system component associated with a control circuitry. The component sends a signal to the control circuitry that the data states are to be written to a particular data state. Upon receiving the signal, the control circuitry writes all of the ferroelectric memory cells in the FRAM array to a preferred memory data state. The memory data states are held in the preferred data state for the entire duration of the event to minimize imprint of the FRAM memory cells. When the event ends the component associated with the control circuitry send a signal to the control circuitry to resume normal memory operation. Other embodiments and structures are also disclosed.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1A:
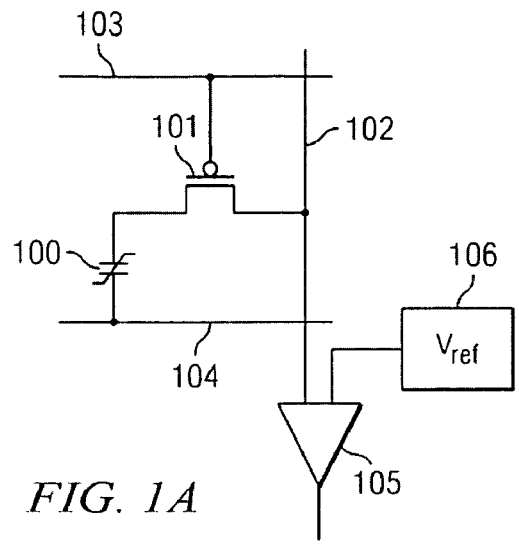
FIG. 1A shows a basic 1T/1C ferroelectric memory cell.

The present invention will now be described with reference to the attached drawing figures, wherein like reference numerals are used to refer to like elements throughout, and wherein the illustrated structures and devices are not necessarily drawn to scale.

FIG. 1A shows an exemplary FRAM memory cell. This cell comprises a ferroelectric capacitor 100 with a first terminal coupled to a plate line 104 and a second terminal coupled to a transistor 101. The transistor is further coupled to a bit line 102 and a word line 103 at its gate. When a voltage greater than the threshold voltage of the transistor is applied to the word line 103 the transistor turns on, coupling the ferroelectric capacitor 100 to the bit line 102. The bit line 102 is further coupled to a sense amplifier 105 which is coupled to a reference voltage source 106. The reference voltage source 106 provides a reference voltage. The sense amplifier 105 compares the reference voltage to the output of the bit line 102. If the bit voltage is higher than the reference voltage, the sense amplifier 105 will pull the output voltage up. If the bit voltage is lower than the reference voltage, the sense amplifier 105 will drive the output voltage down.

Figure 1B:
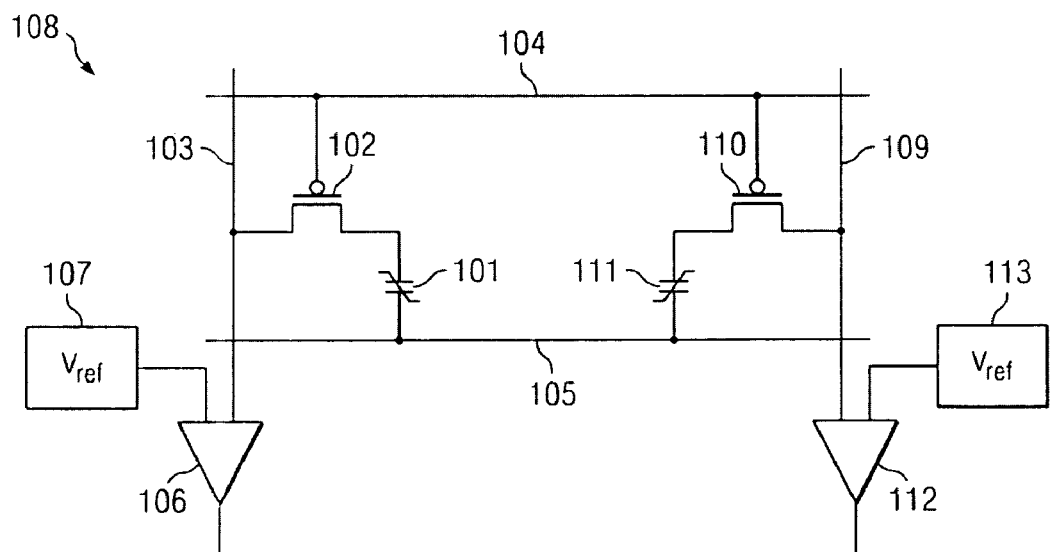
FIG. 1B shows a basic 2T/2C ferroelectric memory cell.

Variations in the architecture of memory cell 100 can also be used to form an FRAM memory cell. FIG. 1B shows a double transistor, double capacitor (2T/2C) structure 108 which uses two transistors and two capacitors to form FRAM memory cells, for example. The 2T/2C structure stores a bit and a complimentary bit in ferroelectric capacitors 101 and 111, respectively. The bit is access by way of the word line 104 and the bit line 103. The complimentary bit is accessed by way of the word line 104 and a complimentary bit line 109. Furthermore, depending on circuit architecture, the reference voltage source can comprise either a voltage reference generator or one or more reference capacitors integrated into the memory array and coupled, through a bit line, to the sense amplifier 105.

The methods and structures described in this disclosure are applicable to a 1T/1C ferroelectric memory cell, a 2T/2C ferroelectric memory cell, or other possible variations of FRAM architecture. Also, while this disclosure will refer to FRAM memory devices, it is understood that the memory devices may be other memory devices as well. For example, memory devices may include memory cells having elements other than ferroelectric capacitive elements that may be affected by imprint or memory devices that may be impacted by signal margin reduction due to time elapse or temperature exposure.

Figure 1C:
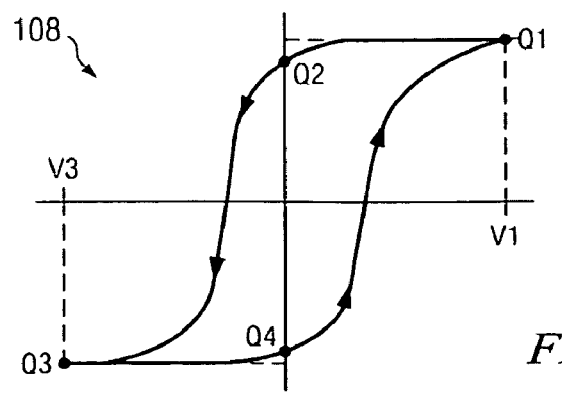
FIG. 1C shows an exemplary hysteresis curve for a ferroelectric material.

The ferroelectric capacitors used in FRAM memory cells comprise the same geometric structure as traditional, dielectric filled, capacitors but use ferroelectric material in place of the dielectric material. Ferroelectric materials undergo a polarization similar to dielectric materials upon subjection to an electric field. However, ferroelectric materials differ from dielectric materials in that, upon removal of the electric field, they retain a degree of polarization. This is the property that allows ferroelectric capacitors to be used in non-volatile memory cells FIG. 1C shows a common hysteresis loop 120 for an FRAM memory cell. FRAM memory cells are formed from capacitors which comprise a ferroelectric material between their anode and cathode plates. The ferroelectric material exhibits hysteresis as shown in FIG. 1C. Hysteresis properties are essential to the operation of FRAM memory cells. FIG. 1 illustrates a curve showing the total charge on the capacitor as a function of the applied voltage. As the applied voltage changes, the charge stored on the capacitor will follow the curve of FIG. 1C. For example, when a voltage, V1, is applied to the ferroelectric capacitor the dipoles of the ferroelectric material will polarize, storing a charge, Q1, on the ferroelectric capacitor. When the applied voltage is removed, the charge on the ferroelectric capacitor will follow the curve to the point Q2. Application of a negative voltage, V3, across the ferroelectric capacitor will drive the charge stored along the curve to Q3. Upon removal of the applied voltage a charge of Q4 will remain on the ferroelectric capacitor. The charge remaining on the capacitor when it is at zero volts, Q2 or Q4, corresponds to data states of "0" or "1". Therefore, FIG. 1C shows how data states are stored by a ferroelectric capacitor in the absence of an applied voltage (i.e., in a non-volatile manner).

Operation of the FRAM memory cell of FIG. 1A has two main operations, reading from the memory cell and writing to the memory cell. Both the reading and writing of ferroelectric memory cells can be done using a "step sensing" approach, so named since a step voltage is applied to the plate line prior to sensing, or a "pulse sensing" approach, wherein a pulse is applied to the plate line prior to sensing. The disclosed invention is applicable to ferroelectric memory cells using either approach.

Figure 2:
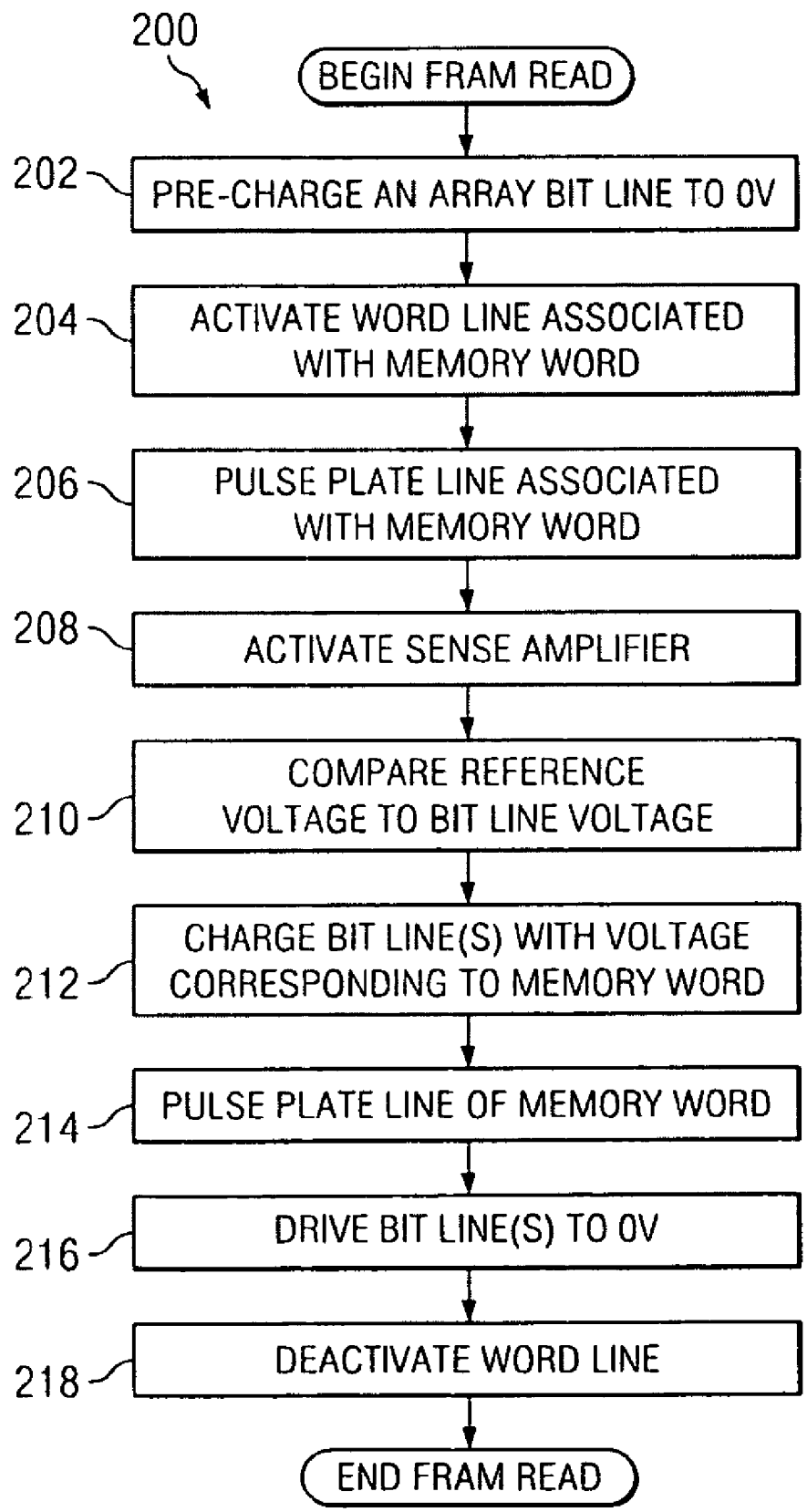
FIG. 2 is an exemplary methodology for reading an FRAM memory array.

FIG. 2 shows a prior art, pulse sensing, method 200 of reading from the ferroelectric memory cell of FIG. 1A by applying voltages along the bit line, word line, and plate line of the memory cell. At 202 the bit line 102 associated with the memory cell to be read is pre-charged to 0V. The word line 103 is then activated at 204. The activation of the word line 103 couples the bit line 102 to the ferroelectric capacitor 100. At 206 the plate line 104 is pulsed causing charge sharing between the bit line 102 and the ferroelectric capacitor 100. This charge sharing discharges the ferroelectric capacitor 100 into the bit line 102 raising the voltage of the bit line 102. At 208 the sense amplifier 105 is turned on. The sense amplifier 105 compares the voltage of the bit line 102 to a reference voltage from the reference voltage generator 106 at 210. If the bit line voltage is above the reference voltage it will be pulled up. If the bit line voltage is below the reference voltage it will be driven down.

Reading a high data state (i.e., "1") from a ferroelectric memory cell is a destructive action (i e., upon being read a "0" is written to all ferroelectric capacitor cells). Therefore, a memory word must often be rewritten to the ferroelectric capacitor 100 after it is read. At 212 the bit line 102 is charged to a voltage that corresponds to the memory state that was read from the memory cell coupled to the bit line 102. The plate line 104 is pulsed at 214, creating charge sharing between the bit line 102 and the ferroelectric capacitor 100. This charge sharing charges the ferroelectric capacitor 100 to store the data state associated with the voltage of the bit line 102. After the pulse is over, at 216 the bit line 102 is driven to 0V. At 218 the bit line 102 is deactivated. Writing data to a ferroelectric memory cell is done in a manner similar to the actions of 212 to 218 of FIG. 2.

Imprint is one area which is commonly identified as a failure mechanism of FRAM memory. Imprint is the tendency of a ferroelectric capacitor which stays in the same polarization state over a long period of time preferentially maintain that state, weakening the ability to write and read the complement polarization state. It is dependent upon many factors including materials used, time, memory architecture, and temperature. It is also dependent upon the state of the FRAM memory cell at the time the bake is performed. Imprint has the effect of shifting the hysteresis curve of a ferroelectric material with respect to the applied voltage. This effect has important implications for ferroelectric memory arrays. Over time, imprint will create a growing offset voltage which eventually will make distinction between data states (e.g., "0" or "1") impossible.

Figure 3A:
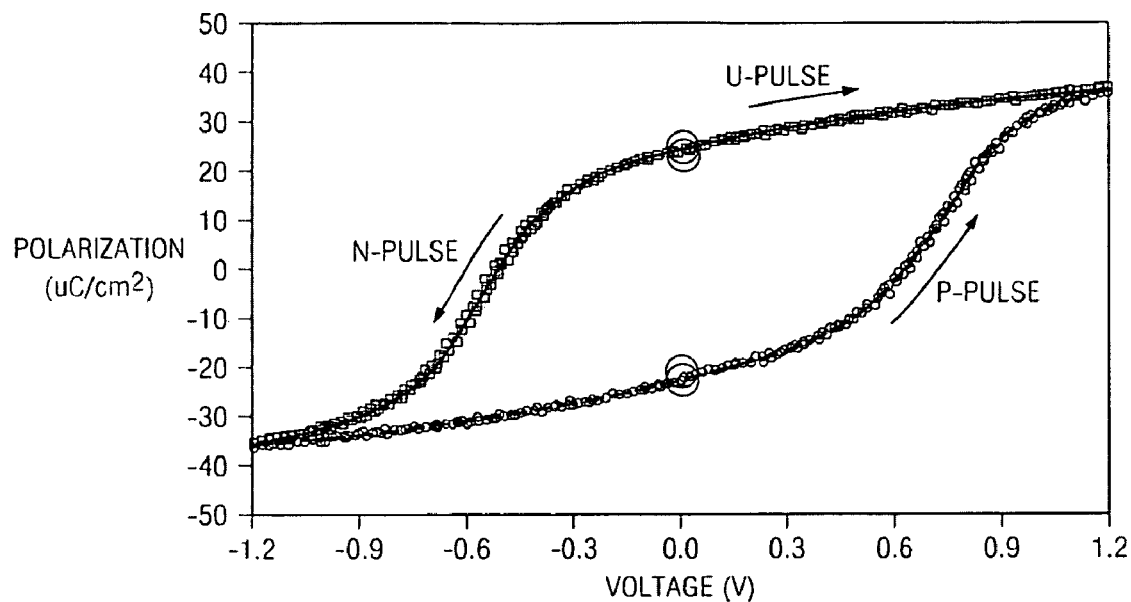
FIG. 3A shows a hysteresis loop labeled with the PUND sequence pulse definitions for FRAM testing.
Figure 3B:
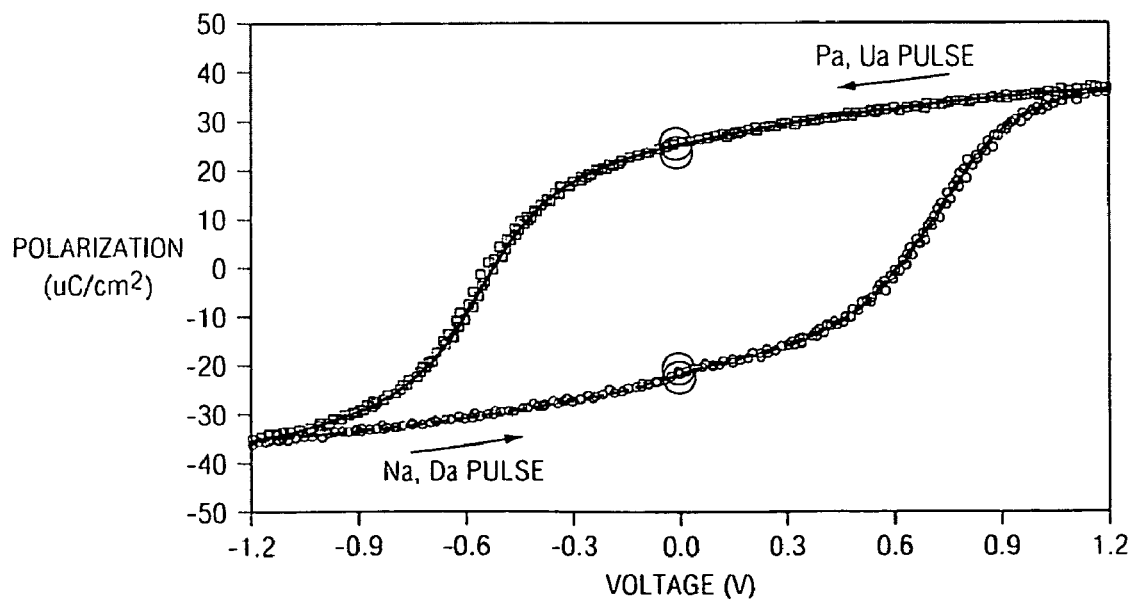
FIG. 3B shows a hysteresis loop labeled with "after terms" of the PUND sequence pulse definitions for FRAM testing.

Testing FRAM retention is essential to the study of imprint. One method of testing FRAM memory cells uses a PUND sequence. FIGS. 3A and 3B show a hysteresis curve labeled with the pulses of a PUND sequence. In a PUND sequence there are "on pulse" terms and "after pulse" terms. FIG. 3A shows the on-pulse terms labeled P, U, and N. P and U are positive pulses. P reads a Data 1 and writes a Data 0 state. U reads a Data 0 and writes a Data 0 state. N is a negative pulse. N only writes a data 1 state, because only positive pulses can be used to read FRAM cells. FIG. 3B shows the after-pulse terms of $P_a$, $U_a$, $N_a$, and $D_a$ pulses. The after pulse terms represent the portion of hysteresis detected from saturation polarization level towards the remnant state.

Figure 4A:
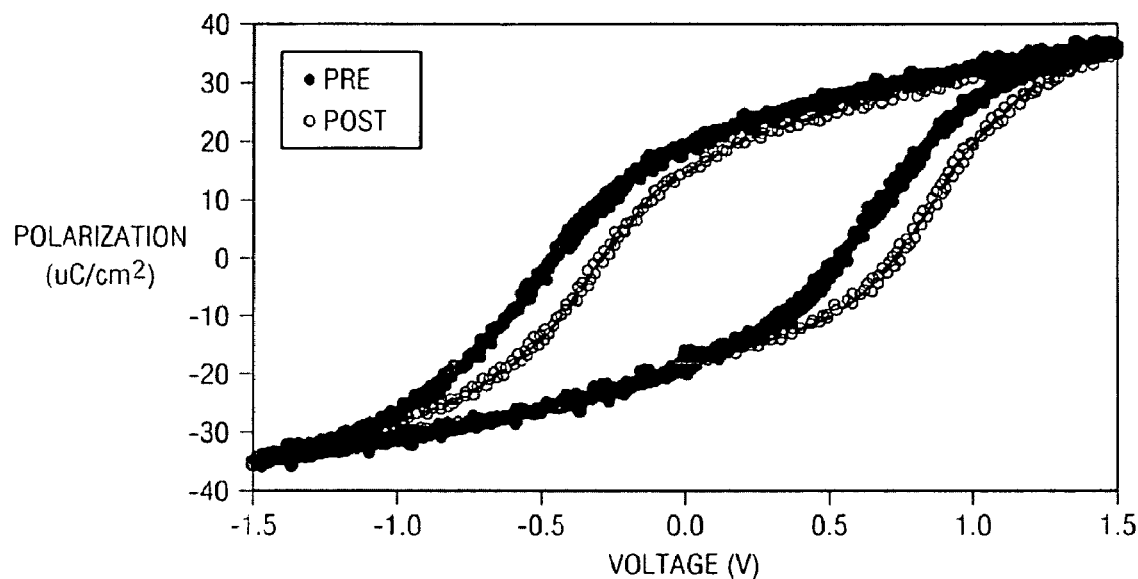
FIG. 4A shows the hysteresis curves of ferroelectric memory cells comprising capacitors written to a high data state before and after a high temperature exposure.
Figure 4B:
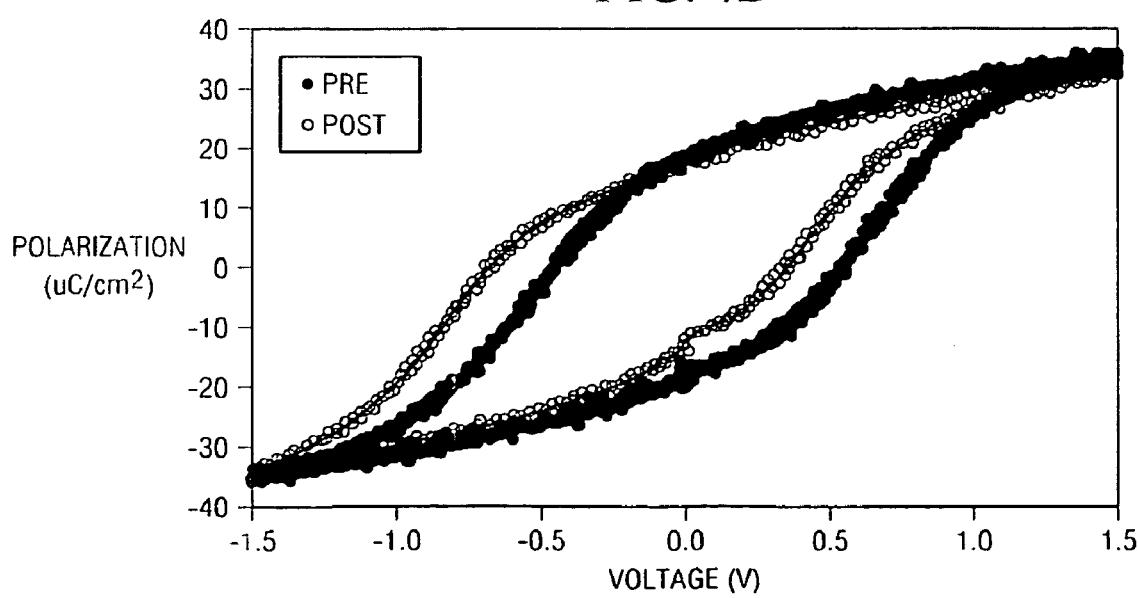
FIG. 4B shows the hysteresis curves of ferroelectric memory cells comprising capacitors written to a low data state before and after a high temperature exposure.

FIGS. 4A and 4B show exemplary hysteresis curves of ferroelectric memory cells. FIG. 4A shows the hysteresis curve of a ferroelectric memory cell written to a high data state before ("PRE") and after ("POST") a high temperature exposure. FIG. 4B shows the hysteresis curve of a ferroelectric memory cell written to a low data state before and after a high temperature exposure. Both graphs show that the hysteresis curves, after the high temperature exposure, have been shifted with respect to the hysteresis curves prior to the high temperature exposure.

Reading the signal margin difference between the PRE, non-shifted, hysteresis curve and POST, shifted, hysteresis curve, by the application of a PUND sequence, illustrates the effect of imprint on the memory cells. For example, the same state (SS) polarization margin for on-pulse terms is $P_B$-$U_A$. In FIG. 4A the shifted hysteresis loop causes U to slightly increase therefore slightly decreasing the polarization margin. In the opposite state (OS), the polarization margin for on pulse terms is defined as $P_A$-$U_B$. In the OS the shifted hysteresis curve decreases P, therefore decreasing the polarization margin. Similarly, the polarization margin of the after pulse term for the OS, $(P-P_a)_A$-$(U-U_a)_B$, experiences a greater signal margin decrease than the after pulse term for the SS, $(P-P_a)_B$-$(U-U_a)_A$.

Figure 5A:
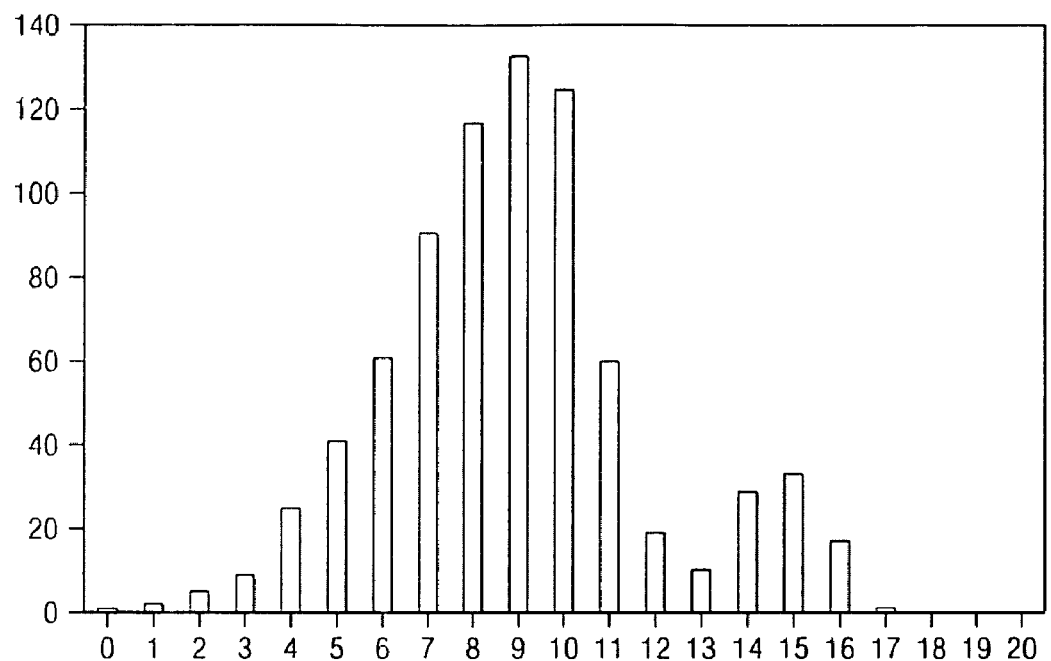
FIG. 5A shows the voltage-separation between the highest low data state and the lowest high data state for a 1T/1C ferroelectric memory cells in a high data state.
Figure 5B:
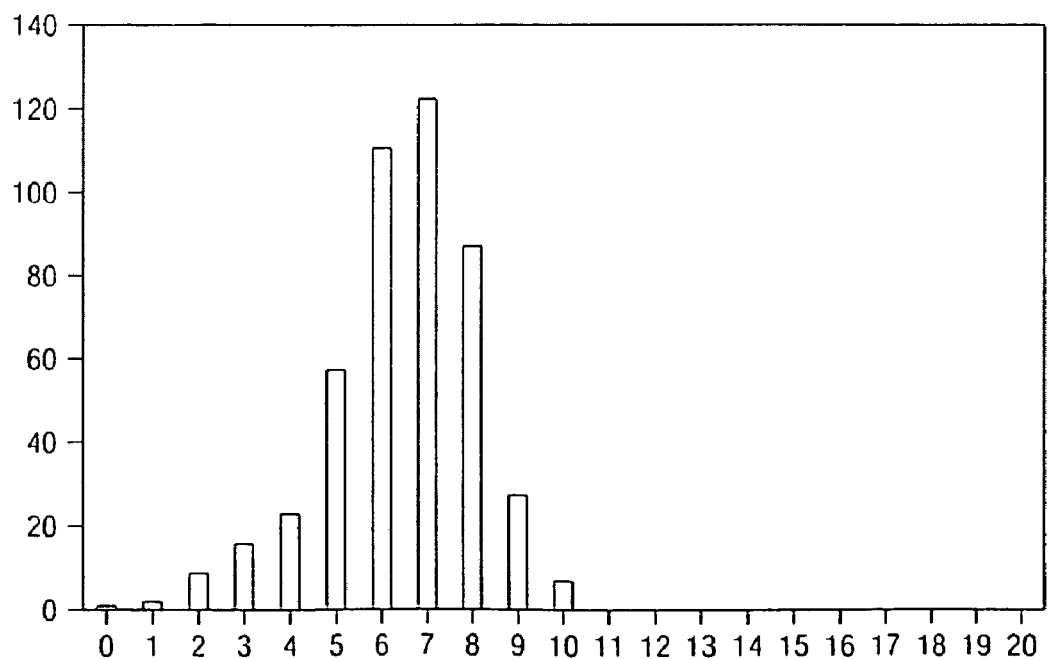
FIG. 5B shows the voltage-separation between the highest low data state and the lowest high data state for a 1T/1C ferroelectric memory cells in a low data state.

FIGS. 5A and 5B show the voltage-separation between the highest low data state and the lowest high data state for a plurality of 1T/1C ferroelectric memory cells comprising capacitors that have been integrated into a back end of the line (BEOL) metallization. FIG. 5A shows the voltage separation of a plurality of ferroelectric memory cells after being exposed to a high temperature bake, wherein the ferroelectric memory cells were written to a low data state prior to the bake. FIG. 5B shows the voltage separation of a plurality of ferroelectric memory cells after being exposed to a high temperature bake, wherein the ferroelectric memory cells were written to a high data state prior to the bake. The elevated temperature of the bake will simulate a longer length of time at normal operating temperatures and therefore accelerate imprint of the ferroelectric memory cells. Comparing the two figures shows that the effect of imprint on ferroelectric memory cells may depend on the data state stored in the cell during the high temperature exposure and therefore that a ferroelectric memory cell, set to a preferred data state prior to high temperature exposure, will experience a decrease in the effect of imprint. However, whether the preferred data state is high or low is dependent upon the process or architecture used and therefore the implementer of the method must determine which data state a particular process or architecture should use.

Figure 6:
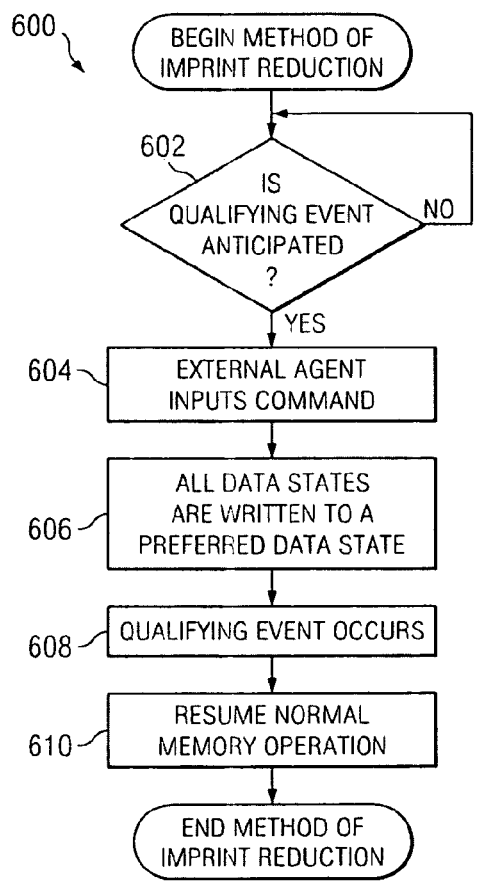
FIG. 6 is one embodiment of the present invention, an exemplary method for improving the imprint of a ferroelectric memory cell by writing all the memory cells to a high data state prior to a qualifying event.

FIG. 6, shows one embodiment of the present invention. This embodiment is a method 600 by which all data states of an FRAM memory array are written to a preferred data state prior to an external qualifying event. The external qualifying event is broadly defined as an event which will cause imprint to the ferroelectric memory cells of the FRAM array. Since imprint is caused as time elapses and is accelerated by high temperatures a qualifying event may comprise exposure of the FRAM memory array to an elevated temperature, packaging an FRAM memory array, or shipping an FRAM memory array, for example. The inventors have contemplated a wide variety of qualifying events for which the use of method 600 would be beneficial.

While method 600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Further, one or more of the acts depicted herein may be carried out in one or more separate acts and/or phases.

Method 600 is based upon changing the data state of the FRAM memory cells by a decision that is made independent of the data state stored in the FRAM array at that time. No information pertaining to the data state is used in deciding to switch the data state and therefore there is no need for testing prior to writing the data states as is taught in some prior art methods.

The method of this embodiment is begun by anticipation of an external qualifying event at 602. This method places the FRAM memory cell data states in a preferred data state prior to the event, and therefore anticipation of the event is required. This is an easily fulfilled requirement in most situations as fabrication steps, packaging, and shipments often well defined and predetermined.

At 604 an agent external to the FRAM memory array and IC chip comprising it will send a command to the control circuitry that the data states are to be written to a preferred data state. The external agent may comprise a person or may be an in-line manufacturing computer system, for example.

All of the ferroelectric memory cells are written to the preferred data state at 606. The preferred data state may be either a high data state or low data state depending on the process or architecture used. For memory writes outside of manufacturing, the preferred data state will be pre-defined and stored in a memory location separate from the FRAM memory array. The control circuitry associated with the FRAM memory array may write the preferred data state by using the method described in FIG. 2, for example.

At 608 the qualifying event occurs. The memory data states are held in the preferred data state for the entire duration of the qualifying event to minimize imprint of the FRAM memory cells. The qualifying event ends, and a command is sent from the external agent to the control circuitry to resume normal memory operation at 610.

The problem of imprint is especially important to FRAM memory arrays that have been manufactured and are preparing to undergo assembly. During assembly an embedded FRAM memory undergoes a number of processes which expose the memory array to a high temperature environment accelerating the imprint damage to the FRAM memory array as shown in FIGS. 5A and 5B.

Figure 7:
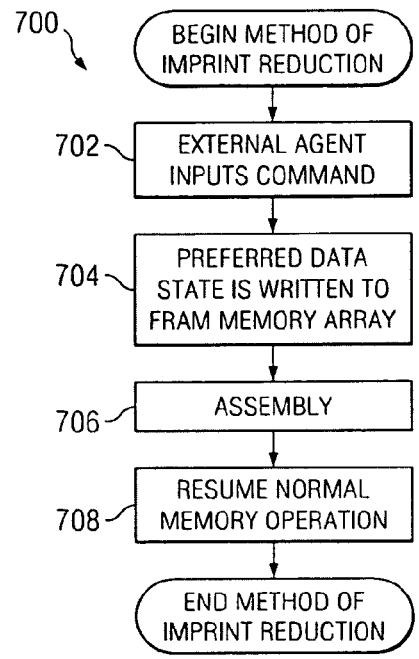
FIG. 7 is an additional embodiment of the present invention, an exemplary method for improving the imprint of a ferroelectric memory cell by writing all the memory cells to a high data state prior to assembly.

FIG. 7 shows an additional embodiment of the present invention. In this embodiment, the method of 600 is specifically applied for use prior to an FRAM memory array undergoing assembly.

At 702 the wafer undergoes processing. Processing may comprise front end of the line processes such as device formation for memory arrays. Processing may also comprise back end of the line processes such as metal interconnect formation. The formation of the functional devices of the memory array will be completed at 702, therefore allowing a memory state to be stored in each of the cells of an FRAM memory array.

At 704, while the FRAM memory array is still at wafer level, a preferred data state is written to cells of the memory array. Both 1T/1C and 2T/2C memories are written to the preferred data state. 2T/2C memory arrays are written to the preferred data state using a 1T/1C mode to ensure all of the bits are written to the preferred data state. After the 2T/2C memory arrays have undergone writing to a preferred state they will resume normal 2T/2C operation. For example, a 2T/2C memory array being written to a preferred state in a 1T/1C mode may, upon power-up, resume 2T/2C operation mode. In one embodiment the preferred data state is written to the memory array as one of the last steps of the wafer probe processes just prior to assembly. In an alternative embodiment the preferred data state is written to the memory array at the final test of the memory array in packaged form prior to shipment of the integrated chips.

In one embodiment all memory cells comprising the memory array are written to the preferred data state prior to assembly. In an alternative embodiment memory arrays required to store code prior to final assembly are not written to a preferred data state, while memory arrays not required to store code until after final assembly is complete are written to a preferred data state. This later embodiment is applicable in situations where it is necessary to write code to a memory array prior to completion of packaging. For example, identification information (e.g., die ID, product serial number) may be written to a memory array prior to the completion of packaging. Individual users will determine which embodiment is required for their particular use, but if possible, it is preferable to write the code as the last step, after all high temperature processes have been completed.

At 706 the FRAM memory array undergoes assembly. Assembly will typically comprise die attach, wire bond, lid seal, and finish steps. Depending on the integration scheme in use these steps may vary.

Prior to the die attach, integrated chips must undergo die preparation. During die preparation the wafers are sawed into individual chips. The die are then attached to the packaging during die attach. There are a number of different packages that can be used as well as a number of adhesive materials for connecting the packages. The choice of material will depend on the application and demands of the chip. For example, the package may comprise a pressed alumina ceramic, a laminated alumina ceramic, or a molded package. For the alumina ceramic the die adhesion material may be silver filled glass. For the laminated alumina the die adhesion material may be gold-silicon eutectic or silver filed cyanate ester. For the molded plastic packages the die adhesion material may be silver filled epoxy.

The varying adhesion materials will require varying process temperatures during die attach. For example, gold silicon eutectic must be raised to a temperature of approximately 363° C. before the eutectic alloy will melt securing the chip to the package. Other adhesive material similarly must be raised to high temperatures during the die attach phase of assembly.

The wire bond step may comprise either traditional wire bonding (i.e., ball bonding or wedge bonding) or controlled collapse chip connection (C4) to provide electrical connection between the silicon chip and the external leads of the semiconductor device. For either method, recent trends have moved towards the use of lead free solders. Lead free solders will typically use temperatures in the range of 240° C.-280° C. for approximately 10 seconds.

The lid seal process will also expose the integrated chip and embedded memory to a high temperature environment. The lid seal process hermetically seals the IC package from the external environment. Precious metal eutectic seals may use metal alloys such as Au—Sn to form a hermetic seal, for example. An alloy comprising 80% Au and 20% Sn requires a melting temperature of 280° C.

At 708 assembly ends and memory cells are free to be written to either a high or low data state, as normal memory operation requires.

Figure 8:
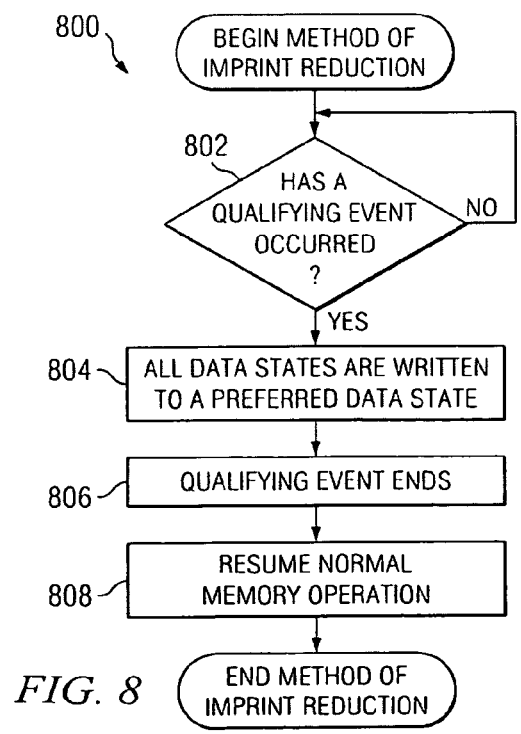
FIG. 8 is an alternative embodiment of the present invention, wherein the data states of the ferroelectric memory cells are written to a preferred data state after detection of a qualifying event.

FIG. 8 shows an alternative embodiment of the present invention. This embodiment is a method 800 by which all data states of an FRAM memory array are written to a preferred data state upon experiencing a qualifying event.

The method of this embodiment is begun by detection of a qualifying event at 802. Detection of the qualifying event is performed by a system component associated with the control circuitry. The system component may comprise a temperature monitoring component or a clock component, for example. Method 800 offers protection against unexpected imprint damage as opposed to method 600 which protects against anticipated imprint damage. For example, method 800 would write all memory cells of a memory array to a preferred data state upon a memory array being exposed to an unexpected high temperature environment.

At 804 all of the ferroelectric memory cells are written to a preferred data state. As in method 600, the preferred data state may be either a high data state or low data state depending on the process or architecture used.

At 806 the qualifying event ends. For example, if the event satisfying 802 was exposure to a high temperature, 806 would be an end to the high temperature exposure. The system component associated with the control circuitry will detect when the qualifying event ends and send a command to the control circuitry to resume normal memory operation at 808.

The methods of the above embodiments may be used with either a 1T/1C or a 2T/2C computer architecture. In a 1T/1C FRAM architecture the memory data state is written to the preferred state. In a 2T/2C FRAM architecture, which stores a true bit and a compliment, it is preferable to have all the bits in a 1T/1C mode preferred state.

In the method of either 600, 700 or 800 the content of the memory array will be lost upon putting the memory cells in a preferred state. In an additional embodiment data states corresponding to critical information (e.g., code) stored in the memory cell are copied to another, non-ferroelectric, memory location prior to the memory cells being written to a preferred state. Copying the data states to another memory location is done to ensure that the data stored in the memory locations is not lost when the memory cells are written to a preferred state.

Figure 9:
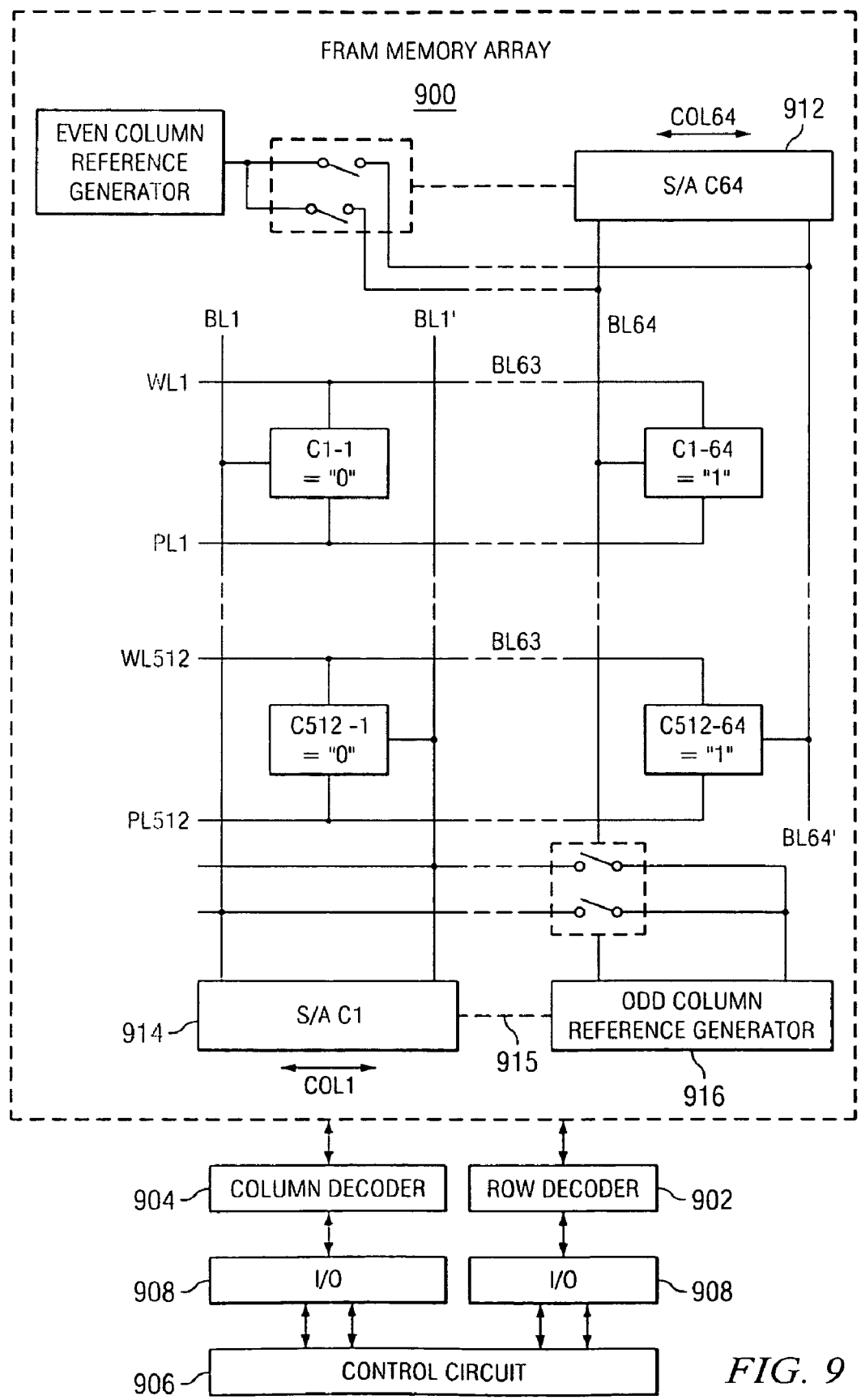
FIG. 9 shows a block diagram of a memory cell, support circuitry, and control circuitry.

FIG. 9 shows a block diagram of a memory organization 900. The memory array 902 is connected to row 904 and column 906 decoders, which route information to and from addresses within the memory array. The decoders, 904 and 906, are connected to an input/output (I/O) interface 908.

Furthermore, a control circuitry 910 is included. The control circuitry 910 is important in implementation of the above embodiments. The control circuitry will write the data states of the memory array to a preferred data state. In method 800 the control circuitry ensures that a qualifying event has occurred. In an alternative embodiment an optional temperature monitor 912 is added to the memory architecture. The temperature monitor provides a signal to the control circuitry 910 if the temperature exceeds a predetermined temperature range. The control circuitry 910 will then write the memory data states high.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of enhancing the reliability of a ferroelectric random access memory (FRAM) array, comprising:
    anticipating an occurrence of a qualifying event, wherein the qualifying event is as an event which will cause imprint damage to at least one of a plurality of ferroelectric memory cells forming the FRAM array;
    sending a first command to a control circuitry to write a part of the plurality of ferroelectric memory cells to a preferred data state, wherein the first command may originate from either an agent external or internal to an integrated chip comprising the FRAM array; and
    maintaining the plurality of ferroelectric memory cells in the preferred data state, wherein after the qualifying event is completed the plurality of ferroelectric memory cells are allowed to freely change data states.

2. The method of claim 1, wherein the preferred data state is a high data state.

3. The method of claim 1, wherein the preferred data state is a low data state.

4. The method of claim 1, wherein the qualifying event comprises an assembly of the integrated chip comprising the FRAM array, and wherein the assembly of the integrated chip comprises a series of actions to secure the integrated chip into an integrated chip package.

5. The method of claim 4, wherein the plurality of ferroelectric memory cells is written to the preferred data state at wafer probe prior to the assembly of the integrated chip.

6. The method of claim 4, wherein the plurality of ferroelectric memory cells is written to the preferred data state at a final test of the FRAM array in packaged form prior to a shipment.

7. The method of claim 5, wherein the part of the plurality of ferroelectric memory cells comprises ferroelectric memory cells which are not used for storing data prior to the assembly of the integrated chip.

8. The method of claim 5, wherein the part of the plurality of ferroelectric memory cells comprises an entire plurality of ferroelectric memory cells.

9. The method of claim 4, wherein the integrated chip package comprises one of: a plastic package, a laminated package, or a ceramic package.

10. The method of claim 8, wherein the integrated chip comprises a plurality of external leads.

11. The method of claim 10, wherein assembly of the integrated chip comprises a wire bonding action that provides an electrical connection between the FRAM array and the plurality of external leads, and wherein the wire bonding action uses a lead free solder.

12. The method of claim 4, wherein the FRAM array is a 2T/2C memory array, and wherein writing the preferred data state to the part of the plurality of ferroelectric memory cells is performed with the FRAM array in a 1T/1C mode.

13. The method of claim 4, further comprising storing at least one memory data state of the FRAM array in a non-ferroelectric memory location prior to writing the part of the plurality of ferroelectric memory cells to the preferred data state.

14. The method of claim 1, wherein the qualifying event comprises exposure to a high temperature.

15. A method of enhancing the reliability of a ferroelectric random access memory (FRAM) array, comprising:
    detecting the occurrence of a qualifying event, wherein the qualifying event is as an event which will cause imprint damage to at least one of a plurality of ferroelectric memory cells of the FRAM array, and wherein the qualifying event is detected by a component associated with a control circuitry of an integrated chip;
    sending a first command to write an entire plurality of ferroelectric memory cells to a preferred data state, wherein the first command is sent from the component associated with the control circuitry to the control circuitry; and
    maintaining the plurality of ferroelectric memory cells in the preferred data state, wherein after the qualifying event is completed the plurality of ferroelectric memory cells are allowed to freely change data states.

16. The method of claim 15, wherein the preferred data state is a high data state.

17. The method of claim 15, wherein the preferred data state is a high data state.

18. The method of claim 15, wherein the qualifying event comprises assembly of the integrated chip, comprising the FRAM array, into an integrated chip package.

19. The method of claim 18, wherein the FRAM array is a 2T/2C memory array, and wherein writing the preferred data state to the entire plurality of ferroelectric memory cells is performed with the FRAM array in a 1T/1C mode.

* * * * *